(12) United States Patent
Reber

(10) Patent No.: US 6,876,255 B2
(45) Date of Patent: Apr. 5, 2005

(54) LINEAR AMPLIFIER USING NON-LINEAR CMOS CAPACITORS

(75) Inventor: Martin Reber, Zürich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 28 days.

(21) Appl. No.: 10/480,354

(22) PCT Filed: Jun. 18, 2002

(86) PCT No.: PCT/IB02/02328
§ 371 (c)(1),
(2), (4) Date: Dec. 21, 2003

(87) PCT Pub. No.: WO03/001660
PCT Pub. Date: Jan. 3, 2003

(65) Prior Publication Data
US 2004/0164797 A1 Aug. 26, 2004

(30) Foreign Application Priority Data
Jun. 21, 2001 (EP) ............................. 01202403

(51) Int. Cl.[7] ................................. H03F 3/45
(52) U.S. Cl. ..................... 330/252; 330/110; 330/69
(58) Field of Search ..................... 330/110, 69, 252, 330/258, 259, 260, 261, 264, 265, 267

(56) References Cited

U.S. PATENT DOCUMENTS

| 5,789,981 | A | * | 8/1998 | Singer et al. ............... 330/253 |
| 5,847,604 | A | * | 12/1998 | Dekker .................... 330/149 |
| 6,377,120 | B1 | * | 4/2002 | Hsieh ...................... 330/253 |

\* cited by examiner

Primary Examiner—Henry Choe
(74) Attorney, Agent, or Firm—Aaron Waxler

(57) ABSTRACT

The invention provides an amplifier circuit made by digital CMOS processes, the amplifier circuit comprising a main operational amplifier with at least one input and at least one output and a feedback loop including a non-linear gateoxide capacitor, wherein a voltage control means is connected to the main operational amplifier to provide a voltage difference between the output common mode voltage and the input common mode voltage of the main operational amplifier to apply a DC biasing voltage across the non-linear gateoxide capacitor sufficient to operate the non-linear gateoxide capacitor in a bias range where the capacity of the none-linear gateoxide capacitor is almost independent of the applied voltage comprising the bias voltage plus a signal voltage.

12 Claims, 4 Drawing Sheets

LINEAR AMPLIFIER USING NON-LINEAR CMOS CAPACITORS

The invention relates to an operational amplifier circuit comprising a main operational amplifier with at least one input and at least one output and a feedback loop including a non-linear capacitor.

Modern receiver architectures for mobile communication do not use IF stages at high frequency but are near-zero-IF circuits. Usually a single mixer stage shifts the incoming RF signal to a very low frequency IF at which analogue I and Q signals are then directly converted to digital signals. The digital I and Q signals are passed to a digital signal processing circuit to perform the demodulation of the received input signal. The most important analogue circuit block of the described receiver architecture is the polyphase filter which acts as channel selection filter. This circuit usually occupies the largest area of the receiver circuit and is, therefore, critical for the overall performance. Commercial CMOS realizations of near-zero-IF receivers are so far not available due to penalties imposed by CMOS polyphase filters in terms of size and performance.

One of the most critical performance issues is the required linearity of the channel selection filter. Usually, this linearity requirement requires special analogue process options which allow the production of highly linear capacitors. Standard CMOS processes using such analogue process option become more expensive and are no longer competitive to solutions which avoid analog process options. Furthermore, the analogue process options for CMOS processes have usually a longer delay due to extra process development time in comparison to baseline CMOS processes. The availability of circuits which do not need the analogue process option, supports a short time to market.

The limiting factor for the implementation of analogue filters with very high linearity in a pure digital CMOS process is the realization of the capacitors. There are in principle three ways for implementing capacitors in pure digital processes. Either a backend metal plate capacitor or a MOS capacitor, a gateoxide capacitor or a junction capacitor, may be used. The metal plate capacitor is highly linear but has the drawback of a large size which is about eight times the size of a gateoxide capacitor. The gateoxide capacitor is much smaller but has a non-linear characteristic. The junction capacitor offers lower capacitor densities than the gateoxide capacitor and has a non-linear characteristic as well.

There are attempts trying to linearize the gateoxide capacitor either by using gateoxide capacitors in a parallel or series configuration. A configuration with two gateoxide capacitors in an anti-parallel arrangement is quite small and has an improved linearity for zero biasing voltage. However, two capacitors are required. A series arrangement of two gateoxide capacitors is somewhat larger but as a good linearity if biased for example by means of a diode arranged between the two capacitors. However, the series arrangement of two gateoxide capacitors has the disadvantage of reduced voltage swing and long set up times. Therefore, former capacitor realizations result in either too large or too non-linear capacitors for telecommunication products.

In view of the above, it is the object of the invention to provide an operational amplifier circuit having an excellent linearity in spite of using non-linear capacitors in a feedback loop related to a main operational amplifier included in the operational amplifier circuit.

For this purpose, the invention provides an operational amplifier circuit comprising a main operational amplifier with at least one input and at least one output and a feedback loop connected to the input and the output including a non-linear capacitor, wherein a voltage control means is connected to the main operational amplifier to provide a voltage difference between the output common mode voltage and the input common mode voltage of the main operational amplifier to apply a DC biasing voltage across the non-linear capacitor sufficient to operate the non-linear capacitor in a bias range where the capacity of the non-linear capacitor is substantially independent of the applied voltage comprising the bias voltage plus a signal voltage.

The operational amplifier circuit of the invention is a new way to linearize non-linear capacitors, in particular MOS capacitors available in ordinary digital MOS or CMOS processes, to build up circuits with very high linearity like channel selection filters, e.g. polyphase filters for telecommunication applications. The operational amplifier circuit of the invention provides an enabling technology to integrate digital and analogue hardware in future telecommunication platforms in a single chip. The operational amplifier circuit of the invention, furthermore, provides an advantageous way to overcome the above described problems with non-linear capacitors just by operating the capacitors with a biasing voltage such that the non-linear capacitors are operated in a state where the capacity is almost independent of the applied signal to be processed. The circuit of the invention combines the advantage of a small size non-linear capacitor with the excellent linearity which this circuit shows for comparatively large bias voltages which are, for example for gateoxide capacitors, above 1, 2 V.

The operational amplifier circuits which are constructed according to the invention can be used as integrator circuit to build a high order active filter. The integrator circuit represents a basic building block for many applications like sigma delta converters, regulators or analog filter banks. It can be used in standard CMOS processes where highly linear capacitors are not available.

According to a preferred embodiment of the invention, the feedback loop comprises a resistor in parallel to the non-linear capacitor. The different common mode voltages at the input and the output, respectively, of the main operational amplifier results in a DC current through the resistor providing for a biasing voltage across the non-linear capacitor in a simple and efficient way.

According to a further preferred embodiment of the invention, the non-linear capacitor is a MOS transitor or a gateoxide capacitor. This allows the non-linear capacitor to be manufactured in a simple MOS or CMOS process with the advantage that the manufacturing of this circuit element can be integrated in the overall manufacturing process, and that there are no special analogue options necessary. A gateoxide capacitor is easier to integrate in the manufacturing process of the overall circuit and offers high capacitor densities.

According to a further preferred embodiment of the invention, the a non-linear capacitor is a junction capacitor.

According to a further preferred embodiment of the invention, the voltage control means is adapted to provide a preset DC output common mode voltage to the input of the operational amplifier. The preset DC output common mode voltage can thus be appropriately selected to provide the required biasing voltage at the non-linear capacitor.

According to a further preferred embodiment of the invention, the voltage control means comprises a voltage regulator for regulating the common mode output voltage of the main operational amplifier to the preset output common mode voltage. Thereby, the common mode output voltage of the main operational amplifier is automatically regulated to a voltage value which is preset at the voltage regulator. The voltage regulator is an advantageous solution for adjusting the common mode output voltage preferably to VDD/2 which is the most preferred value because this is the operating point of the operational amplifier output stages which gives the best possible driving capability.

According to a further preferred embodiment of the invention, the voltage regulator comprises a regulator operational amplifier to one input of which said preset common mode output voltage $CM_{out}$ is fed, and the other input of which regulator operational amplifier is connected via a first resistor to one output of the main operational amplifier and via a second resistor to the other output of the main operational amplifier, and wherein an output of the regulator operational amplifier is connected via a third resistor to one of the inputs of the main operational amplifier and via a fourth resistor to another input of the main operational amplifier. In this arrangement, the regulator operational amplifier functions to regulate the difference of the common mode output voltage of the main operational amplifier and the preset common mode output voltage.

According to a further preferred embodiment of the invention, the first and second resistors have the same resistance value, and wherein the third and fourth resistors have the same resistance value, whereby the circuit arrangement is further simplified.

According to a further preferred embodiment of the invention, the voltage control means comprise an input stage adapted to provide a preset DC common mode voltage to the input of the operational amplifier circuit. This input state is an advantageous means to adjust the input common voltage to a level which is close to the supply voltages in an easy manner. The nodes at the main operational amplifier input represent a virtual ground and AC signals at that point are extremely small.

According to a further preferred embodiment of the invention, the input stage comprises a CM DC voltage source connected to the inputs of the operational amplifier circuit. This is an advantageous way to define the CM voltage at the input of the operational amplifier circuit.

According to a further preferred embodiment of the invention, means for setting an internal voltage $V_T$ at the input stage of the operational amplifier circuit are provided. This is an alternative, advantageous way to define the CM voltage at the input of the main operational amplifier or the operational amplifier circuit, respectively.

According to a further preferred embodiment of the invention, the operational amplifier circuit is made by pure digital CMOS processes. As stated above, the advantages of the operational amplifier circuit of the invention are most pronounced when using a pure digital CMOS process for the manufacture of the semiconductor device as the advantages of a small size non-linear capacitor with excellent linearity of the allover device are achieved in combination.

Embodiments of the invention are now described with reference to the drawings, in which.

Figure 1:
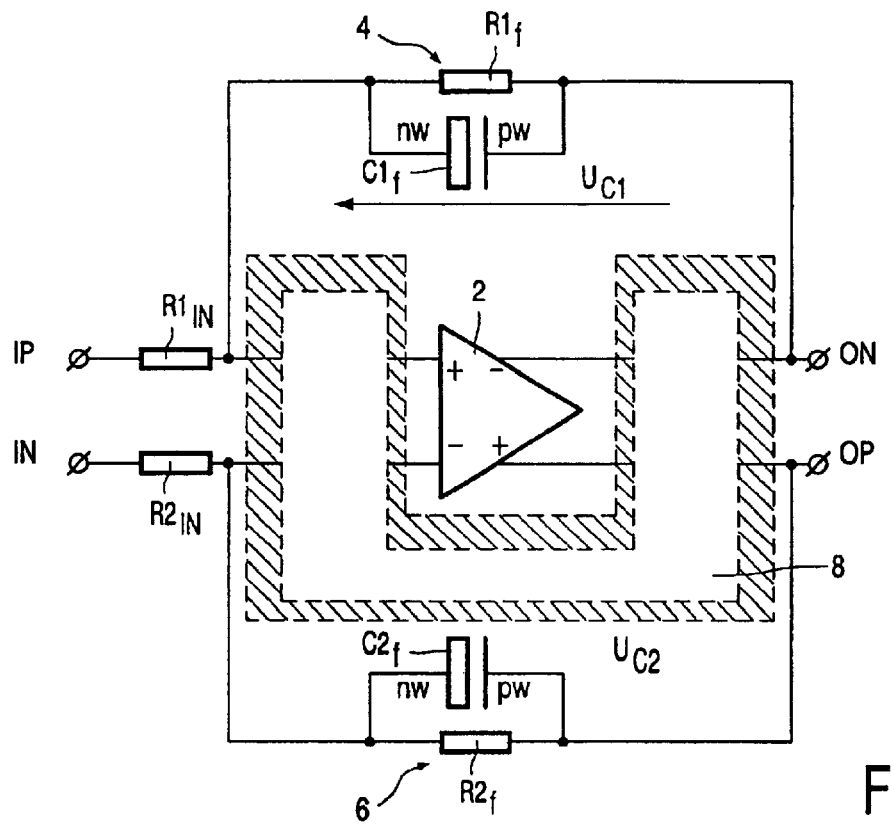
FIG. 1 shows an analogue low pass filter circuit with non-linear gateoxide capacitors as an example of the operational amplifier circuit.

According to FIG. 1, the low pass filter circuit comprises two inputs IP and IN and two outputs ON and OP. The inputs IP, IN are connected to a main operational amplifier 2 through input resistors $R1_{IN}$ and $R2_{IN}$. There are two feedback loops, one from the negative output ON of the main operational amplifier 2 to the positive input IP thereof and another one from the positive output OP of the main operational amplifier 2 to the negative input IN thereof. The feedback loops comprise a feedback resistor $R1_f$ and a capacitor $C1_f$ in the first mentioned feedback loop 4, and a feedback resistor $R2_f$ and a feedback capacitor $C2_f$ in the second feedback loop 6. The feedback resistor $R1_f$ and the capacitor $C1_f$ on the one hand and the feedback resistor $R2_f$ and the feedback capacitor $C2_f$ are connected in parallel, respectively.

A voltage control means 8 is connected to the main operational amplifier 2 to provide a voltage difference between the output common mode voltage and the input common mode voltage of the main operational amplifier 2 to apply a DC biasing voltage across the non-linear gateoxide capacitors $C1_f$ and $C2_f$ sufficient to operate the non-linear gateoxide capacitors $C1_f$ and $C2_f$ in a bias range where the capacity of the gateoxide capacitors $C1_f$, $C2_f$ is almost independent of the applied voltage comprising the bias voltage plus a signal voltage. The voltage control means 8 is adapted to provide a constant DC output common mode voltage to the input of the main operational input amplifier 2.

In the low pass filter circuit of FIG. 1, the voltage control means is put around the main operational amplifier 2 to guarantee a fixed DC biasing voltage $U_C = (U_{C1} + U_{C2})/2$ across the gate oxide capacitors $C1_f$, $C2_f$. This arrangement results in a linear operation and, furthermore, assures that the gateoxide capacitors $C1_f$, $C2_f$ show the largest possible capacitance for a given area.

The different common mode voltage at the inputs and outputs of the main operational amplifier 2 results in a constant DC current through the resistors $R1_f$, $R2_f$. The constant DC biasing voltage $U_C$ can be generated in a way which prevents a reduced output voltage arranged for the low pass filter circuit of FIG. 1.

If the low pass filter circuit of FIG. 1 is cascaded, input and output voltage control means with sufficient driving capability to enable the proper DC current through $R_f/R_{IN}$ are required. Due to cost reasons, large resistors and small gateoxide capacitors are advantageously used and lead to small DC currents through $R_f/R_{IN}$.

In order not to reduce the output voltage range for the filter circuit of FIG. 1, there are two measures necessary to provide a constant DC biasing voltage $U_C$. The first measure is to adjust the common mode output voltage to VDD/2 (one half of the supply voltage). This gives the best possible driving capability. The second measure is to adjust the input common voltage to a level which is close to the supply voltages. The nodes of the main operational amplifier input represent a virtual ground and AC signals at this point are extremely small. To implement this circuit principle, the analogue low pass filter circuit of FIG. 1 can be embodied as shown in FIG. 2.

Figure 2:
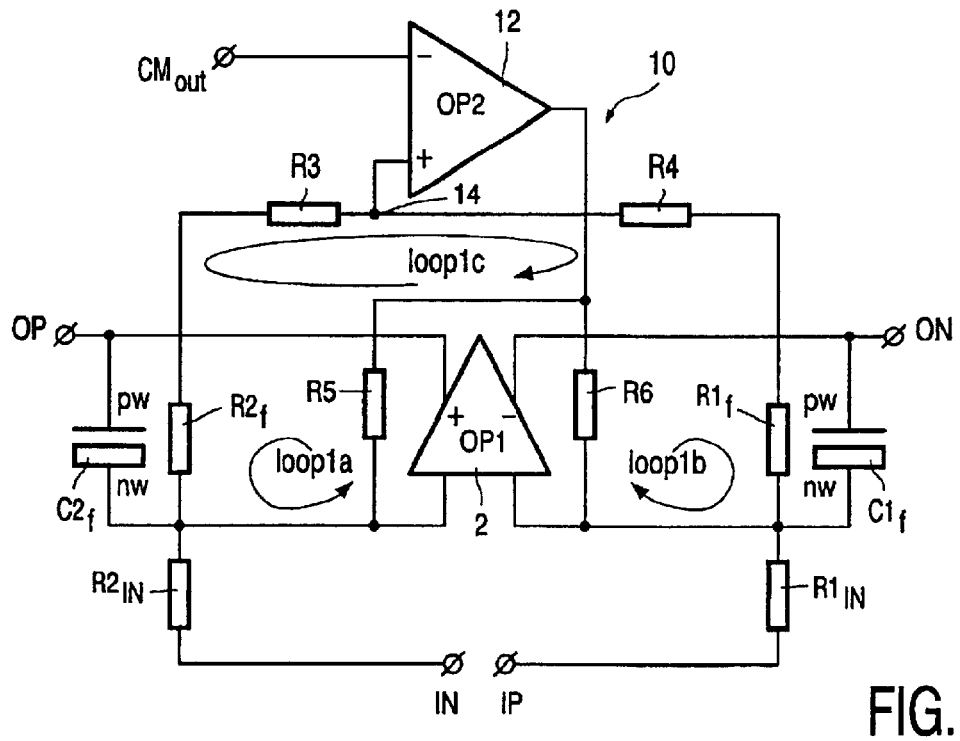
FIG. 2 is a more detailed circuit diagram of the analogue low pass filter circuit of FIG. 1.

The same circuit elements in FIG. 2 have the same reference numerals as in FIG. 1. The voltage control means 8 of FIG. 1 comprise a voltage regulator 10 for regulating the common mode output voltage of the main operational amplifier 2. The voltage regulator comprises a regulator operational amplifier 12 one input of which is fed by a common mode output voltage $CM_{OUT}$ and the other input of which regulator operational amplifier 12 is connected via a first resistor R3 to one output OP of the main operational amplifier 2 and via a second resistor R4 to the other output ON of the main operational amplifier 2. The output of the regulator operational amplifier 12 (OP2) is connected via a third resistor R5 to one of the inputs IN of the main operational amplifier 2 and via a forth resistor R6 to another input IP of the main operational amplifier 2. The first and second resistors R3, R4 have the same resistance value, and the third and forth resistors R5, R6 also have the same resistance value.

In the low pass filter circuit of FIG. 2, the differential input signal at node pair IN/IP is amplified via the main operational amplifier 2, and its feedback loops 1A, 1B and is passed on to the differential output node pair ON/OP. The differential signal transfer function is:

$$U_{out}, \text{diff}/U_{IN}, \text{diff}=(O_{OP}-U_{ON})/(U_{IP}-U_{IN})=R2/R1*1/(1+J\omega R2C1).$$

The common mode output voltage $CM_{out}$ is set at the inverting input of the regulator operational amplifier 12. The non-inverting input of the regulator operational amplifier 12 is connected to the measured common mode output voltage of the main operational amplifier 2 at point 14 between the two resistors R3 and R4. If the measured common mode output voltage of the main operational amplifier 2 is different from $CM_{out}$, the regulator operational amplifier 12 produces at its output a voltage which is fed via R5 and R6 to the inputs of the main operational amplifier 2 and adjusts the common mode output voltage of the main operational amplifier 2 to $CM_{out}$ (circuit loop 1C). The main operational amplifier 2 has an inverting common mode transfer function (or limited common mode suppression.). The common mode input voltage of the main operational amplifier 2 is set with the resistive network consisting of $R1_{IN}$, $R2_{IN}$; $R1_f$, $R2_f$ and resistors R5 and R6. The resistors R5, R6 do not determine the differential signal transfer function.

Figure 3:
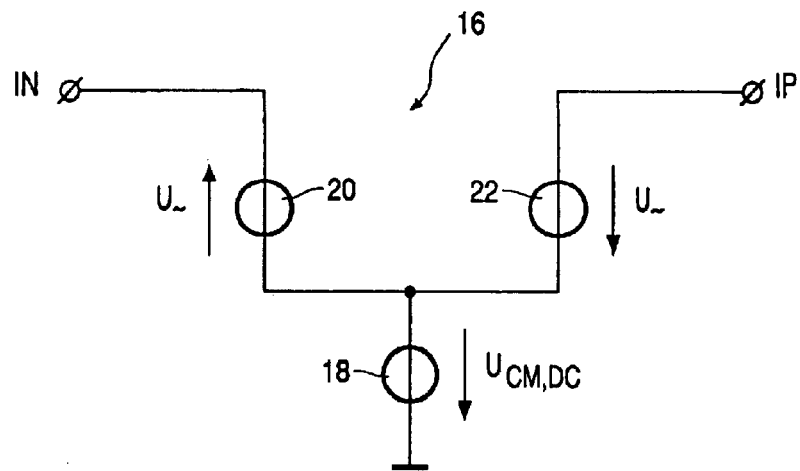
FIG. 3 is a circuit diagram of the input stage to the filter circuits of FIGS. 1 and 2.

The voltage control means 8 of FIG. 1 furthermore comprise an input stage as shown in FIG. 3 which input stage is adapted to provide a preset DC common mode voltage to the input of the low pass filter circuit. The input stage 16 comprises a CM, DC voltage source 18 connected to the inputs IN, IP of the filter circuit of FIG. 1 or 2, respectively. The input signal is fed to the input stage 16 between the CM, DC voltage source 18 and the inputs IN, IP as indicated by voltage sources 20, 22. The input stage 16 adjusts the input common voltage at a level close to the supply voltages.

The main operational amplifier 32 of FIG. 4 consists of a pair of independent, symmetric operational amplifiers 32A, 32B with a chopped input transistors pair as will be described below. The embodiment of FIG. 4 shows that the concept of putting a voltage control means around a main operational amplifier 32 is also applicable if the main operational amplifier 32 consists of a pair of symmetric amplifiers 32A, 32B providing for an excellent linearity of the filter circuit in spite of the fact that the capacitors $C31_f$, $C32_f$ are gateoxide capacitors.

Figure 4:
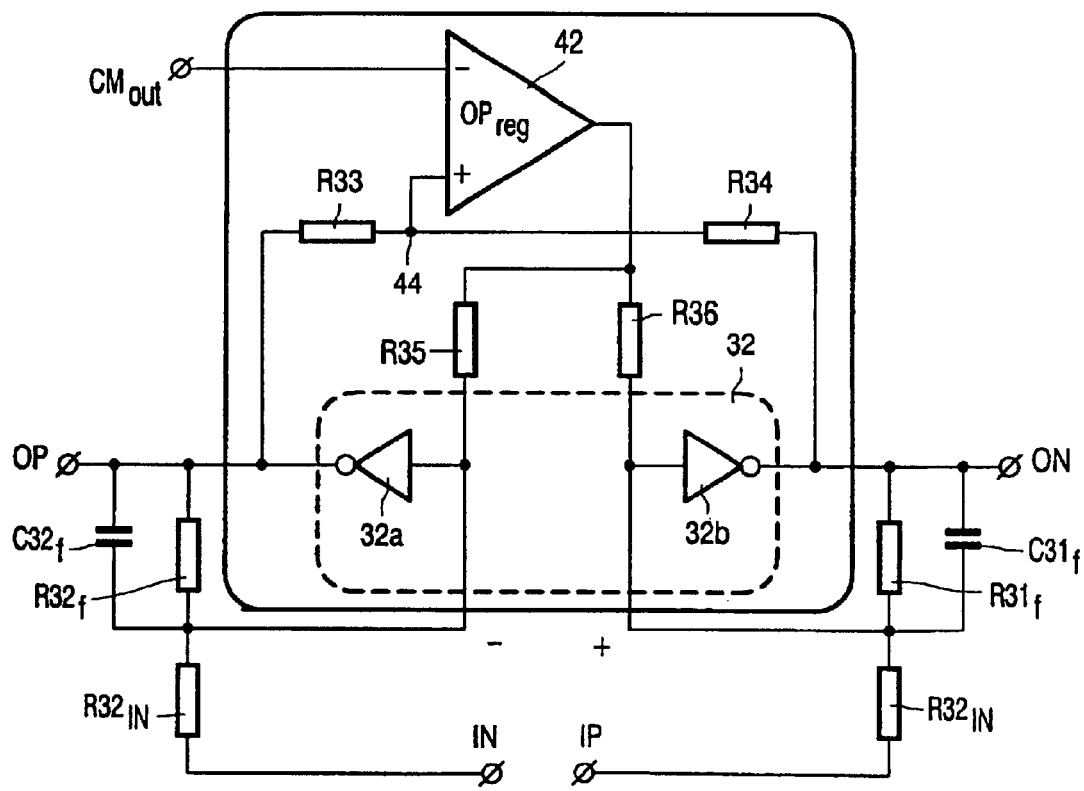
FIG. 4 is a analogue low pass filter circuit with two independent amplifiers with chopped input transistor pair.
Figure 5:
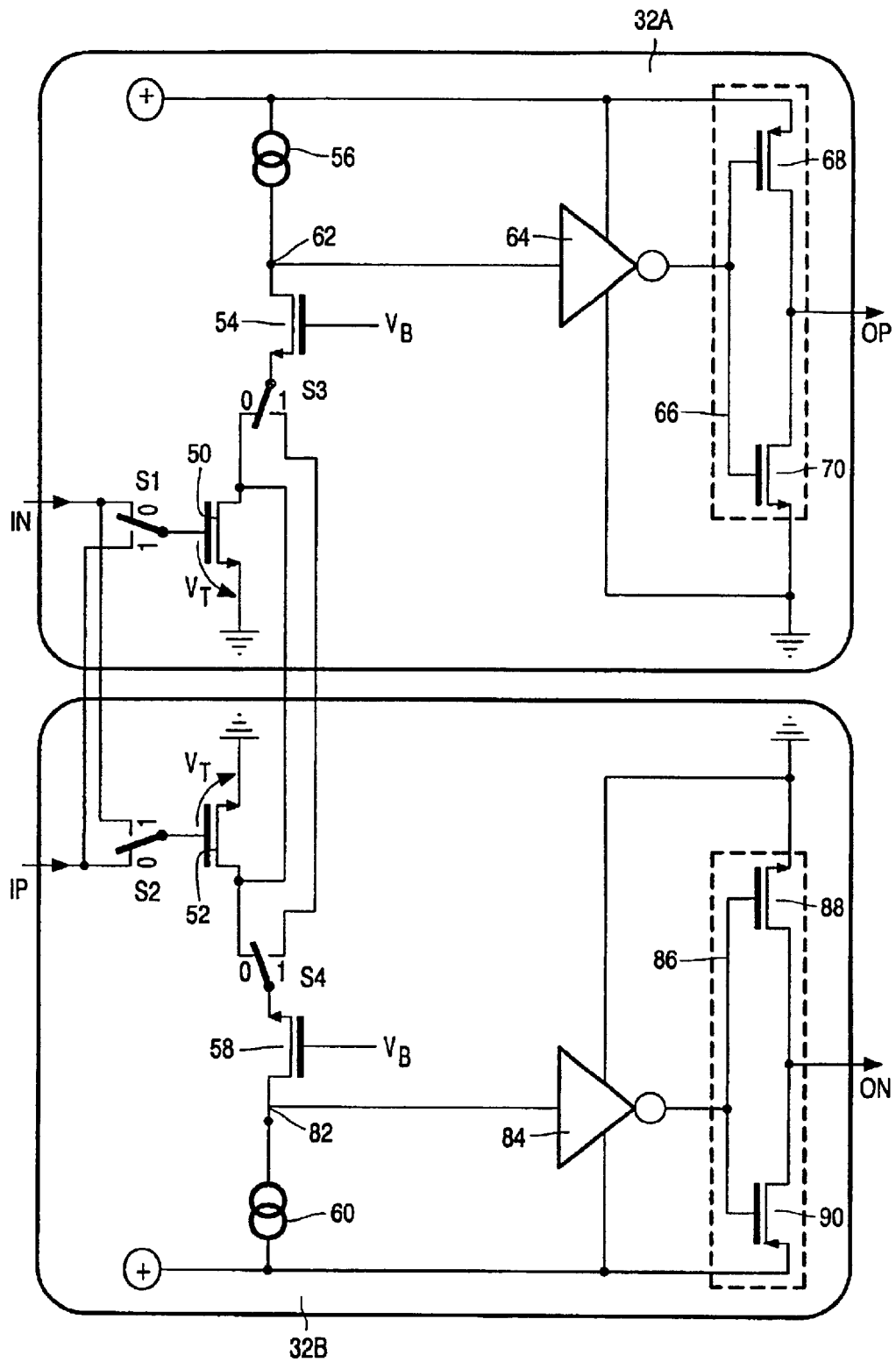
FIG. 5 is more detailed circuit diagram of the low pass analogue filter circuit of FIG. 4.

FIG. 5 shows a more detailed circuit diagram of the symmetric operational amplifiers 32A and 32B of FIG. 4 The filter circuit of FIG. 5 comprises two chopped input transistors 50, 52 with chopper switches S1, S3 related to transistors 50 and chopper switches S2, S4 related to transistors 52. The chopper switches S1–S4 are connected to each other and to the transistors 50, 52 in a well-known chopper system arrangement. The source of transistor 50 is connected to ground and the drain of the transistor 50 is connected through the zero-contact of chopper switch S3, an amplifier transistor 54 and a current source 56 to supply voltage. The source of transistor 52 is grounded and the drain of transistor 52 is connected through the zero-contact of chopper switch S4 and amplifier transistor 58 and current source 60 to supply voltage. Node 62 between transistor 64 and current source 56 is connected through an amplifier 64 to an output stage 66 of amplifier 32A, which output stage 66 consists of two transistors 68, 70. The output stage 66 again is connected between ground and supply voltage.

The node 82 between transistor 58 and current source 60 is connected through an amplifier 84 to an output stage 86 of the operational amplifier 32B which output stage consists of two transistors 88, 90. The output stage 86 again is connected between ground and supply voltage.

In order to embody the feature that the input common voltage is adjusted to a preset level, the sources of the transistors 50, 52 are grounded, and the internal voltage $V_T$ at the input stage of the filter circuit is set. By means of this circuit arrangement, the said input voltage $V_T$ and the regulating function of the regulator operational amplifier 42 provide for the low cost implementation of the circuit device and the excellent linearity required for the specific application.

Figure 6:
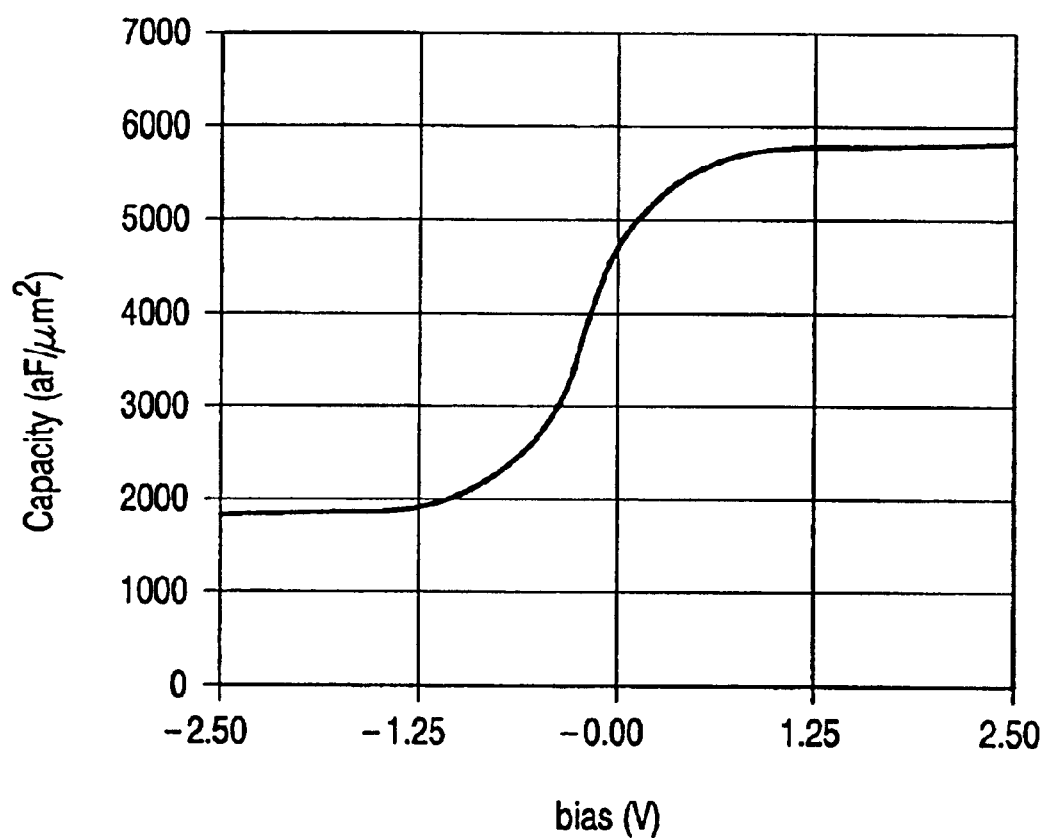
FIG. 6 is a graph showing the relationship between bias voltage and capacity of a non-linear gateoxide capacitor.

FIG. 6 shows the characteristic of a gateoxide capacitor, i.e. the capacitance of the capacitor versus a biasing voltage. FIG. 6 shows that at a bias voltage of >+1,2 V, the capacitance of the capacitor is almost independent of the voltage applied to it, the voltage including the bias voltage plus the signal voltage. Therefore, the bias voltage for such a specific gateoxide capacitor should be somewhat above +1,2 V, e.g. for a 0.25 $\mu$m CMOS process, in order to use this feature for the purpose of the present invention, i.e. to get an excellent linearity of an analogue filter circuit in spite of the fact of the dependency of the capacitance of the capacitor from the bias voltage. It is to be noted that FIG. 6 shows a characteristic curve for a particular gateoxide capacitor, and that the absolute values of the bias voltage and the capacity may change from one gateoxide capacitor to another type of gateoxide capacitor, but the general behavior of the capacitors are the same.

What is claimed is:

1. Amplifier circuit comprising a main amplifier with at least one input and at least one output and a feedback loop connected to the input and the output including a non-linear capacitor, wherein a voltage control means is connected to the main amplifier to provide a voltage difference between the output common mode voltage and the input common mode voltage of the main amplifier to apply a DC biasing voltage across the non-linear capacitor to operate the non-linear capacitor in a bias range where the capacity of the non-linear capacitor is substantially independent of the applied voltage comprising the bias voltage plus a signal voltage.

2. The circuit of claim 1, wherein the feedback loop comprises a resistor in parallel to the non-linear capacitor.

3. The circuit of claim 1, wherein the non-linear capacitor is a MOS transitor or a gateoxide capacitor.

4. The circuit of claim 1, wherein the non-linear capacitor is a juntion capacitor.

5. The circuit of claim 1, wherein the voltage control means is adapted to provide a constant DC output common mode voltage to the input of the amplifier.

6. The circuit of claim 1, wherein the voltage control means comprises a voltage regulator for regulating the common mode output voltage of the main amplifier to the preset output common mode voltage.

7. The circuit of claim 6, wherein the voltage regulator comprises a regulator operational amplifier one input of which is fed by a said common mode output voltage $CM_{out}$, and the other input of which regulator operational amplifier is connected via a first resistor to one output of the main operational amplifier and via a second resistor to the other output of the main operational amplifier, and wherein an output of the regulator operational amplifier is connected via a third resistor to one of the inputs of the main amplifier and via a fourth resistor to another input of the main amplifier.

8. The circuit of claim 7, wherein the first and second resistors have the same resistance value, and wherein the third and fourth resistors have the same resistance value.

9. The circuit of claim 1, wherein the voltage control means comprises an input stage adapted to provide a constant DC common mode voltage to the input of the main amplifier circuit.

10. The circuit of claim 9, wherein the input stage comprises a CM, DC voltage source connected to the inputs of the main amplifier circuit.

11. The circuit of claim 9, comprising means for setting an internal voltage $V_T$ at the input stage of the main amplifier circuit.

12. The circuit of claim 1, wherein the main amplifier circuit is made by digital CMOS processes.

* * * * *